United States Patent [19]
Nguyen et al.

[11] Patent Number: 5,422,895
[45] Date of Patent: Jun. 6, 1995

[54] CROSS-CHECKING FOR ON-THE-FLY REED SOLOMON ERROR CORRECTION CODE

[75] Inventors: Hung C. Nguyen, San Jose; Thomas D. Howell, Los Gatos; Bruce R. Peterson, San Jose, all of Calif.

[73] Assignee: Quantum Corporation, Milpitas, Calif.

[21] Appl. No.: 820,283

[22] Filed: Jan. 9, 1992

[51] Int. Cl.$^6$ .................. G06F 11/10; H03M 13/00
[52] U.S. Cl. .................... 371/37.5; 371/39.1
[58] Field of Search .............. 371/37.5, 37.1, 37.4, 371/38.1, 39.1

[56] References Cited

U.S. PATENT DOCUMENTS

| Re. 34,088 | 10/1992 | Tsang et al. | 371/37.8 |
|---|---|---|---|
| 4,730,321 | 3/1988 | Machado | 371/38 |
| 4,782,490 | 11/1988 | Tenengolts | 371/40 |
| 5,107,503 | 4/1992 | Riggle et al. | 371/37.1 |
| 5,241,546 | 8/1993 | Peterson et al. | 371/37.1 |
| 5,280,488 | 1/1994 | Glover et al. | 371/37.1 |

Primary Examiner—Robert W. Beausoliel, Jr.
Assistant Examiner—T. Tu
Attorney, Agent, or Firm—David B. Harrison

[57] ABSTRACT

An improved cross-checking circuit is provided for use within a Reed-Solomon error correction and cross checking apparatus for performing error correction and cross checking upon a data block within an incoming stream of substantially contiguous data blocks flowing from a source to a destination. The circuit is based upon a distinguished primitive element, alpha$^1$ (2B (Hex))=$x^5+x^3+x+1$, of a Galois field whose elements are represented by residue classes of binary polynomials modulo $p(x)=x^8+x^4+x^3+x^2+1$. The apparatus includes a microcontroller for supervising the flow of the data blocks and for making calculations related to error corrections, and a Galois field syndrome generator and remainder recovery circuit is connected to receive the incoming stream and recover therefrom plural error correction remainder bytes for each block and selectively to hold said bytes in a syndrome latch, the remainder bytes being related to syndrome bytes appended to the data block. The generator and remainder recovery circuit includes the Reed-Solomon cross-checking circuit for recovering cross-checking remainder information related to cross check syndrome information in accordance with the polynomial $GXC(x)=x^2+\text{alpha}^{134}x+\text{alpha}^1$.

14 Claims, 6 Drawing Sheets

CROSS-CHECKING FOR ON-THE-FLY REED SOLOMON ERROR CORRECTION CODE

This is related to U.S. patent application Ser. No. 07/650,791, filed on Feb. 1, 1991, now U.S. Pat. No. 5,241,546.

FIELD OF THE INVENTION

The present invention relates to cross-checking the correction of byte errors detected within a data stream. More particularly, the present invention relates to improved methods and apparatus for reducing the probability of misdetection of error miscorrection within a serial data stream of data blocks, such as data blocks read out from a storage surface within a rotating disk data storage subsystem.

BACKGROUND OF THE PRESENT INVENTION

The present invention comprises an improvement over the cross-checking method and apparatus disclosed in the related parent application, namely U.S. patent application Ser. No. 07/650,791, entitled "On-The-Fly Error Correction with Embedded Digital Controller" now U.S. Pat. No. 5,241,546, the disclosure of which is incorporated herein by reference, (hereinafter referred to as "the referenced patent").

As disk drive areal densities increase, the goal of maintaining low data error rates becomes more difficult. At the same time, increased data throughput rates have led to on-the-fly error correction processes. The use of a 112 bit single and double burst Reed-Solomon on-the-fly error correction code techniques, as described in the referenced patent application, remains a presently preferred manner for detecting and correcting such error bursts.

In an on-the-fly error correction processing environment, once an error condition is detected within a data block, the error correction code remainder bytes, and the cross-check remainder bytes, for that block as obtained by the ECC and cross-check hardware, are latched, and are transferred to an ECC-tasked on-board microcontroller. The block having the detected data error condition is transferred to a temporary block storage location within an on-board block buffer memory array. The ECC and cross-check hardware receives and processes the next block of data incoming from the disk surface.

Simultaneously with the on-going data transfer, the ECC firmware executed by the microcontroller locates and corrects the error or errors and tests the correction with cross-check syndrome bytes which are updated in light of the corrections made to the data bytes. Once the correction process is tentatively completed, a cross-checking process is carried out. If the computational results of the cross-checking process are found to be equal to a reference value, such as zero, the cross-checking process ostensibly determines that the correction is valid, and that a miscorrection has not occurred. Since the cross-check syndrome bytes are based upon a different Reed Solomon generator polynomial than the one employed to generate the ECC syndrome bytes, it is hoped that only proper data corrections will be detected by the cross checking process. Unfortunately, the cross-checking process is susceptible to determination of a correction, whereas a miscorrection has in fact occurred.

The possibility of miscorrection is statistically derived and is known as the "miscorrection probability". A very low miscorrection probability is highly desirable, as miscorrection of erroneous data otherwise results in erroneous data being put out. While a cross-checking process is one known way to determine if a miscorrection has occurred in the ECC process, the cross-checking process may include weaknesses which increase the miscorrection probability.

In the prior approaches as disclosed, for example, in the Tenengolts U.S. Pat. No. 4,782,490, and in the referenced patent, the cross-checking algorithms provided two cross check bytes, each of which separately checked for miscorrection within a cross check interleave of each corrected data block. In that prior approach, there were three Reed-Solomon ECC interleaves within each data block and two cross check interleaves (odd data bytes, and even data bytes) within the same data block, with one cross check byte assigned to the odd bytes cross check interleave and the other cross check byte assigned to the even bytes cross check interleave.

With the prior eight-bit cross check byte approach, the misdetection probability of the cross-checking methodology was determined to be one out of 256 (or $3.9 \times 10^{-3}$). In other words, if the cross-check bytes erroneously became convoluted in such a way that the syndrome becomes zero as a result of a miscorrection, a misdetection occurred; and, that possibility of misdetection existed with a probability of one out of 256.

While a misdetection probability of one out of 256 has been deemed to be adequate to confirm proper correction of most error burst patterns, some error burst patterns have been found which require a greater misdetection capability. For example, if a series of error bursts occurred within the same ECC interleave and also within the same cross check interleave (which can happen if the errors occur at multiples of six apart), the possibility of misdetection arises, and a miscorrection may occur which goes undetected by the cross check procedure. The prior cross-checking methodology has been determined to be ineffectual in detecting miscorrection of such error burst patterns. Thus, a hitherto unsolved need has remained for an error detection method and system which extends the probability of detecting miscorrections occurring within an error correction process, such as Reed-Solomon ECC, or other process such as another cyclic error correction code.

SUMMARY OF THE INVENTION WITH OBJECTS

A general object of the present invention is to provide improved error correction cross-checking methods and apparatus for reducing the probability of misdetecting miscorrections of data error bursts resulting from an error correction process by a factor, which in the preferred example hereof is 256, and in a manner overcoming limitations and drawbacks of the prior art.

Another object of the present invention is to provide an error correction cross-checking method which is applied efficiently to the entirety of a data block, rather than to multiple cross-check interleaves of the data block.

A further object of the present invention is to provide methods and apparatus for implementing improved detection of error bursts miscorrected by an embedded digital controller executing an error correction firmware or software process wherein the error detection process is accomplished in a manner requiring an efficiently minimized amount of additional hardware logic.

A still further object of the present invention is to provide for improved detection of on-the-fly miscorrection of error bursts by an embedded digital controller with minimized additional firmware instructions for implementing the improved cross-checking method.

One more object of the present invention is to provide an improved cross checking generator polynomial based upon a 2B(Hex) primitive alpha$^1$ constant, as follows:

$$G_{xc}(x) = (x + \text{alpha}^1)(x + \text{alpha}^0), \text{ or}$$
$$= (x + \text{alpha})(x + 1), \text{ or}$$
$$= x^2 + \text{alpha}^{134}x + \text{alpha}^1.$$

In accordance with principles of the present invention, an improved cross-checking circuit is provided for use within a Reed-Solomon error correction and cross-checking apparatus. The apparatus performs error correction and cross checking upon a data block within an incoming stream of substantially contiguous data blocks flowing from a source to a destination. The apparatus is based upon a distinguished primitive element, alpha$=x^5+x^3+x+1$, of a Galois field (i.e. a finite field) whose elements are represented by residue classes of binary polynomials modulo $p(x)=x^8+x^4+x^3+x^2+1$. The distinguished element alpha can be more concisely represented by its coefficients: 101011 (binary) or 2B (hexadecimal). The apparatus includes a microcontroller for supervising the flow of the data blocks and for making calculations related to error corrections, and a Galois field syndrome generator and remainder recovery circuit connected to receive the incoming stream and recover therefrom plural error correction remainder bytes for each ECC interleave and selectively to hold the remainder bytes in a syndrome latch, the remainder bytes being related to syndrome bytes appended to the data block. The generator and remainder recovery circuit includes the Reed-Solomon cross-checking circuit for recovering cross-checking remainder information related to cross check syndrome information in accordance with the polynomial $G_{XC}(x)=x^2+\text{alpha}^{134}x+\text{alpha}^1$.

In one aspect of the invention, the Reed-Solomon cross-checking circuit comprises a first summing junction connected to the incoming data stream, a second summing junction, an alpha$^1$ multiplier connected to the first and second summing junctions, a first cross-check byte register connected between the first and second summing junctions, a second cross check byte register connected between the alpha$^1$ multiplier and the second summing junction, the first and second cross check byte registers being connected to the syndrome latch.

In another aspect of the present invention, the Reed-Solomon cross-checking circuit further comprises a first multiplexer for switching between the incoming data stream and an output of the first cross check byte register for enabling cross check syndrome remainder bytes to be appended to each data block passing through the cross-checking circuit.

In a further aspect of the present invention, the Reed-Solomon cross-checking circuit alpha$^1$ multiplier circuit implements the following logical operations:

$Y_0 = X_0 + X_3 + X_5$
$Y_1 = X_0 + X_1 + X_4 + X_6$
$Y_2 = X_1 + X_2 + X_3 + X_7$
$Y_3 = X_0 + X_2 + X_4 + X_5$
$Y_4 = X_1 + X_6$
$Y_5 = X_0 + X_2 + X_7$
$Y_6 = X_1 + X_3$
$Y_7 = X_2 + X_4,$ where $Y_0-Y_7$ represent eight bit positions of an output of the multiplier circuit and wherein $X_0-X_7$ are the eight bit positions of incoming data thereto, and wherein the "+" sign denotes an exclusive-OR logical operation.

In a still further aspect of the present invention, the cross check information supplied to the syndrome latch comprises cross check remainder byte values $XC_0$ and $XC_1$ and the microcontroller calculates updated cross-check syndrome bytes $NXC_0$ and $NXC_1$ in accordance with the relations:

$NXC_0 = (RXC_1 + RXC_0) + E1 + E2 \ldots + E6$, and
$NXC_1 = ((RXC_1 \cdot \text{alpha}^1) + RXC_0)/\text{alpha}^2 + E1 \cdot \text{alpha}^{L1} + E2 \cdot \text{alpha}^{L2} \ldots + E6 \cdot \text{alpha}^{L6}$, where E1, L1; E2, L2; and, E6, L6 represent up to six separate decoded error (E) and location (L) values in the data block provided by the error correction apparatus and methodology as described in the referenced parent application.

In yet another aspect of the present invention the Reed-Solomon cross-checking circuit includes an encoder section and a decoder section for decoding cross-check remainder bytes into updated syndrome bytes in accordance with the relations:

$NXC_0 = (RXC_1 + RXC_0) + E1 + E2 \ldots + E6$, and
$NXC_1 = ((RXC_1 \cdot \text{alpha}^1) + RXC_0)/\text{alpha}^2 + E1 \cdot \text{alpha}^{L1} + E2 \cdot \text{alpha}^{L2} \ldots + E6 \cdot \text{alpha}^{L6}$, where E1, L1; E2, L2; and, E6, L6 represent up to six separate decoded error (E) and location (L) values in the data block provided by the error correction apparatus and methodology (as described in the referenced parent application employing three ECC interleaves per block with the capability of locating and correcting two errors per interleave).

In still one more aspect of the present invention the Reed-Solomon cross-checking circuit encoder section comprises a first summing junction connected to receive the incoming data stream, a second summing junction, an alpha$^1$ multiplier connected to the first and second summing junctions through a second multiplexer, a first cross check byte register connected between the first and second summing junctions, a second cross check byte register connected between the alpha$^1$ multiplier and the second summing junction; and, the decoder section comprises a third summing junction connected to receive the incoming data stream and to an output of the alpha$^1$ multiplier, a first cross-check syndrome register for holding the value $SXC_1$ and connected to the third summing junction and to the first multiplexer and also connected to the syndrome latch, and a fourth summing junction connected to receive the incoming data stream and connected to a second cross-check syndrome register having an output feeding directly back to the fourth summing junction holding said value $SXC_0$ and also connected to the syndrome latch, and wherein the microcontroller is programmed to test the values $SXC_0$ and $SXC_1$ against zero, the second multiplexer being switched between the encoder section and the decoder section in accordance with encoding and decoding operations.

In another facet of the present invention, a method is provided for cross-checking the correctness of a correction made to a data block by an error correction process, wherein the error correction process divides data bytes of the data block into a plurality of interleave segments. The method comprises the steps of:

a. developing a plurality of cross-check bytes based upon all of the data bytes comprising the data block without respect to the interleave segments, in accordance with a predetermined cross check algorithm, and appending the developed plurality of cross-check bytes to the data block, b. developing at least one error correction byte based upon the data bytes and any cross-check byte within each interleave segment, and appending the developed error correction bytes to the data block, c. passing the data block including appended cross-check bytes and error correction bytes through a potentially degrading data transfer medium, such as magnetic data storage disk, d. recovering the data block including recovering the cross-check bytes and error correction bytes from the data transfer medium, e. converting the recovered cross-check bytes into cross-check syndrome bytes, f. processing the recovered error correction bytes to determine if error is present in the recovered data block, g. locating and correcting an error or errors determined to be present in the particular interleave segment of the recovered data block by reference to at least one of the recovered error correction bytes developed within the segment, h. updating the cross-check syndrome bytes by reference to correction of the error determined to be present, and i. testing the updated cross-check syndrome bytes to see if each of them is equal to a predetermined value such as zero, thereby to cross check the correctness of the correction step.

As one aspect of this facet of the invention, the error correction process comprises a Reed-Solomon error correction process for performing error correction upon the data block using digital logic apparatus based upon a distinguished element alpha $(2B(Hex))=x^5+x^3+x+1$ of a Galois field whose elements are represented by residue classes of binary polynomials modulo $p(x)=x^8+x^4+x^3+x^2+1$, and wherein the predetermined cross-checking algorithm comprises a Reed-Solomon cross-checking code in accordance with the polynomial $GXC(x)=x^2+alpha^{134}x+alpha^1$.

As another aspect of this facet of the invention, the $alpha^{134}$ multiplier term is carried out by implementing the following $alpha^1$ multiplier:

$Y_0=X_0+X_3+X_5$
$Y_1=X_0+X_1+X_4+X_6$
$Y_2=X_1+X_2+X_3+X_7$
$Y_3=X_0+X_2+X_4+X_5$
$Y_4=X_1+X_6$
$Y_5=X_0+X_2+X_7$
$Y_6=X_1+X_3$
$Y_7=X_2+X_4$ and then XORing the resultant product with x, where $Y_0-Y_7$ represent eight bit positions of an output of a multiplier for performing the $alpha^1$ multiplication term of the Reed-Solomon cross-checking code polynomial, and wherein $X_0-X_7$ are the eight bit positions of incoming data thereto, and wherein the "+" sign denotes an exclusive-OR logical operation. With this simplified, logic-reduced approach, the $alpha^{134}$ multiplier performs these operations:

$Y_0=X_3+X_5$
$Y_1=X_0+X_4+X_6$
$Y_2=X_1+X_3+X_7$
$Y_3=X_0+X_2+X_3+X_4+X_5$
$Y_4=X_1+X_4+X_6$
$Y_5=X_0+X_2+X_5+X_7$
$Y_6=X_1+X_3+X_6$
$Y_7=X_2+X_4+X_7$ and, this approach saves as many as 18 additional exclusive-OR gates in the implementing logic circuitry which would otherwise be required to implement the $alpha^{134}$ multiplier directly.

As a further aspect of this facet of the invention, the data transfer medium comprises a data storage disk of a fixed disk drive.

These and other objects, aspects, advantages and features of the present invention will be more fully understood and appreciated by those skilled in the art upon consideration of the following detailed description of preferred embodiments, presented in conjunction with the accompanying drawings.

DETAILED DESCRIPTION OF PREFERRED EMBODIMENTS

Figure 1:
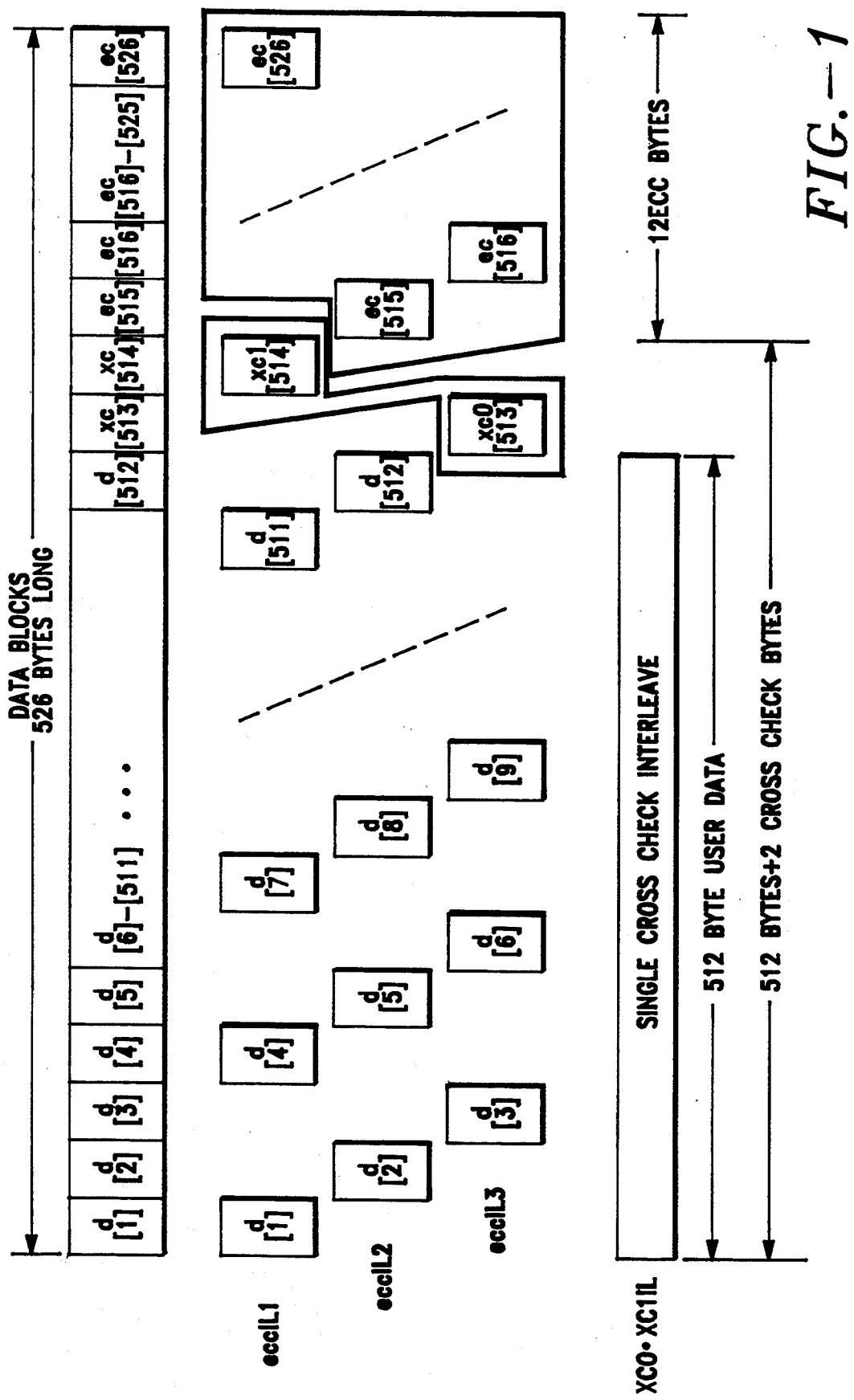
FIG. 1 is a series of graphs of a data block including a field of 512 user data bytes, followed by two cross-check bytes, followed by 12 error correction bytes. In this example, the field is divided into three error correction interleaves IL1, IL2 and IL3, and in accordance with the present invention, a single cross-check interleave including the entire user data field.

The following description employs terms and reference numerals which are chosen to be consistent insofar as practical with the reference numerals for the same structural elements appearing in the referenced patent.

Thus, the following explanation should be construed in light of the disclosure of the referenced patent.

With reference to FIG. 1, an exemplary data block of 526 bytes includes e.g. 512 user data bytes d[1]–d[512], two cross-check remainder bytes $XC_0$[513] and $XC_1$[514] and twelve ECC remainder bytes ec[515]–ec[526]. In the FIG. 1 example, the 526 bytes of the data block are arranged into three error correction interleaves: interleave ecclL1 which includes data bytes [1], [4], [7] . . . , cross check byte $XC_1$[514], and ECC remainder bytes ec[517], [520], [523], and [526]; interleave ecclL2 which includes data bytes [2], [5], [8] . . . , ECC bytes [515], [518], [521], and [524]; and interleave ecclL3 which includes data bytes [3], [6], [9] . . . , cross check byte $XC_0$[513], and ECC bytes [516], [519], [522], and [525]. Each of the three interleaves is encoded with four ECC remainder bytes.

As illustrated in FIG. 1, in accordance with the present invention, the two cross check bytes $XC_0$ and $XC_1$ are derived from a single cross check "interleave" including all 512 data bytes. While the cross check bytes are based only upon the 512 byte user data field, the four ECC bytes for the first and third ECC interleaves ecclL1 and ecclL3 respectively take into account the cross check remainder bytes $XC_1$ and $XC_0$, so that any burst errors including the cross check bytes may also be detected and corrected by the ECC process as described in the referenced patent.

Figure 2:
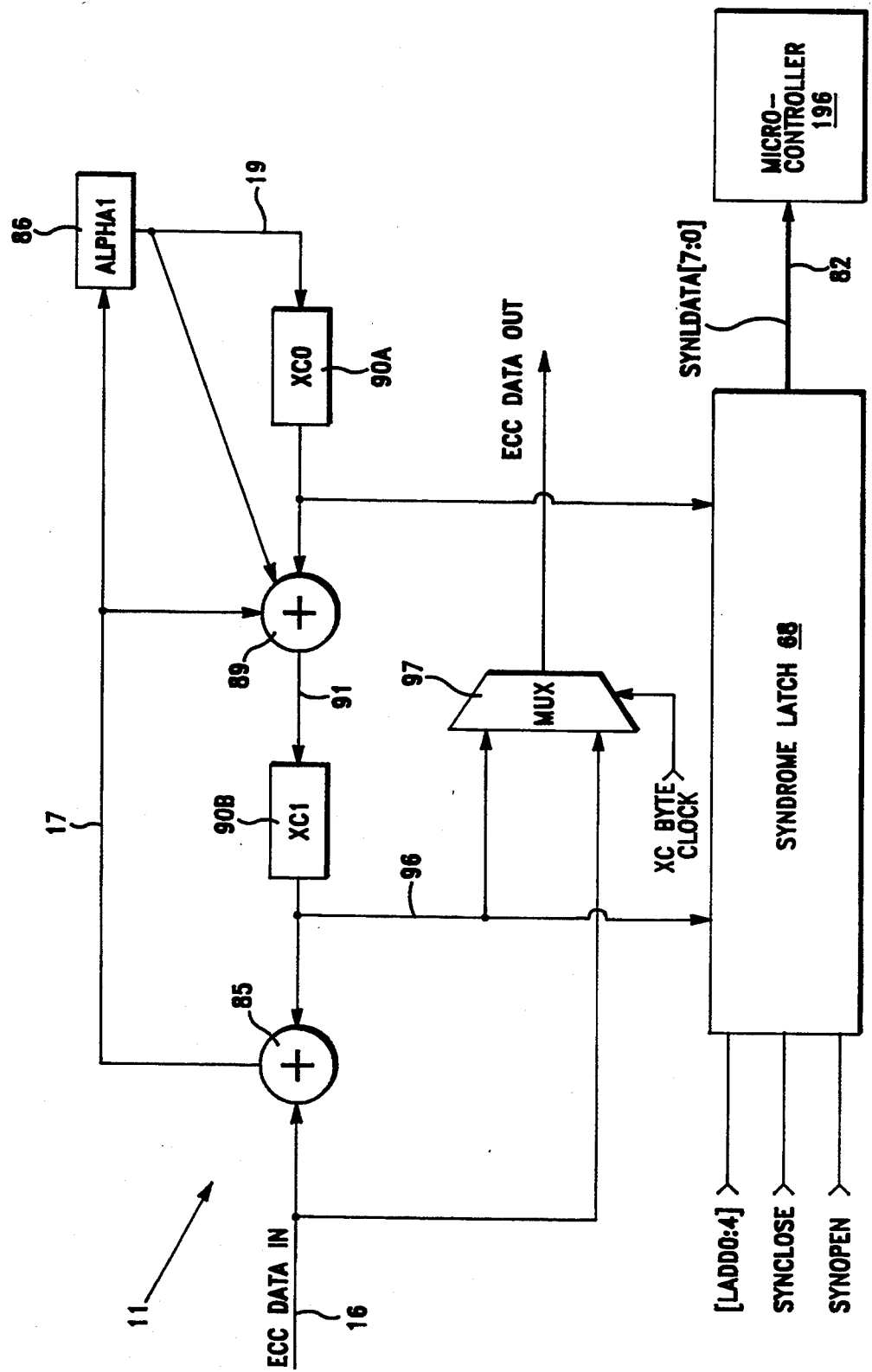
FIG. 2 is one presently preferred embodiment of a block diagram of an encoder/decoder for appending and recovering cross check bytes from the FIG. 1 data block, in accordance with principles of the present invention.

Turning now to FIG. 2, an improved cross-check remainder byte encoder/decoder circuit 11 is shown. In this figure, reference numerals of elements described in the referenced patent are continued for the same structural elements, to aid in clarity of understanding and to avoid unnecessary repetition in the description. In the referenced parent application, the $alpha^1$ constant is equal to 2B(HEX). Also, in the referenced patent, the cross check algorithm is:

$$G_{xc}(x) = x^2 + alpha^1. \quad (24)$$

The new and improved cross check algorithm implemented by the configuration of the FIG. 2 encoder/decoder circuit 11 is:

$$\begin{aligned} G_{xc}(x) &= (x + alpha^1)(x + alpha^0), \text{ or} \\ &= (x + alpha)(x + 1), \text{ or} \\ &= x^2 + alpha^{134}x + alpha^1. \end{aligned} \quad (24a)$$

This new algorithm is based upon the same 2B(Hex) primitive $alpha^1$ constant, and has been discovered to be significantly more powerful in checking the entire data field of each data block, thereby extending the miscorrection detection probability to one in $256^2$ (or $1.5 \times 10^{-5}$). Advantageously, as explained above, the $alpha^{134}$ term may be reduced to $(1+alpha^1)$.

Since the $alpha^1$ multiplier 86 is already present (see FIGS. 2 and 3), it is not necessary to implement separately an $alpha^{134}$ multiplier in order to realize circuitry implementing this improved cross check algorithm. By not having to implement separately the $alpha^{134}$ multiplier, as many as 18 additional exclusive-OR gates are thereby rendered unnecessary, leading to a streamlined cross-check circuit implementation.

In the FIG. 2 cross-checking encoder/decoder circuit 11, data from a buffer (during writing) enters a first byte-wide summing circuit 85 via an ECC data in bus 16. An output bus 17 from the summing circuit 85 enters an $alpha^1$ multiplier 86. The $alpha^1$ multiplier 86 provides an output to a first cross check register 90a and also directly to a second byte-wide summing circuit 89, which receives other inputs from the bus 17 and from the register 90a. An output 91 from the second summing circuit 89 feeds into a second cross check byte register 90b. The second cross check byte register 90b has an output bus 96 which feeds into the first summing circuit 85 and also into a multiplexer 97 which functions to append the two cross check bytes $XC_0$ and $XC_1$ onto the outgoing data block in byte positions [513] and [514] as shown in FIG. 1. These cross check bytes $XC_0$ and $XC_1$ are respectively contained in registers 90A and 90B after the occurrence of 512 successive data byte clock periods of a particular data block.

At other times, the multiplexer 97 passes the data bytes [1] through [512] which also pass through the error correction circuit 10 described in the referenced patent in order that the 12 ECC remainder bytes may also be generated and appended in byte positions [515] through [526] of the data block.

The $alpha^1$ multiplier 86 shown in FIG. 2 is implemented in accordance with the following series of relationships, implemented with e.g. 16 exclusive-OR gates, as follows:

$Y_0 = X_0 + X_3 + X_5$
$Y_1 = X_0 + X_1 + X_4 + X_6$
$Y_2 = X_1 + X_2 + X_3 + X_7$
$Y_3 = X_0 + X_2 + X_4 + X_5$
$Y_4 = X_1 + X_6$
$Y_5 = X_0 + X_2 + X_7$
$Y_6 = X_1 + X_3$
$Y_7 = X_2 + X_4$ where $Y_0$–$Y_7$ represent the eight bit positions of the output of the multiplier 86 and wherein $X_0$–$X_7$ are the eight bit positions of incoming data thereto. (In the foregoing table of equations, and throughout this specification, unless otherwise indicated, the "+" sign denotes an exclusive-OR operation.)

Figure 4:
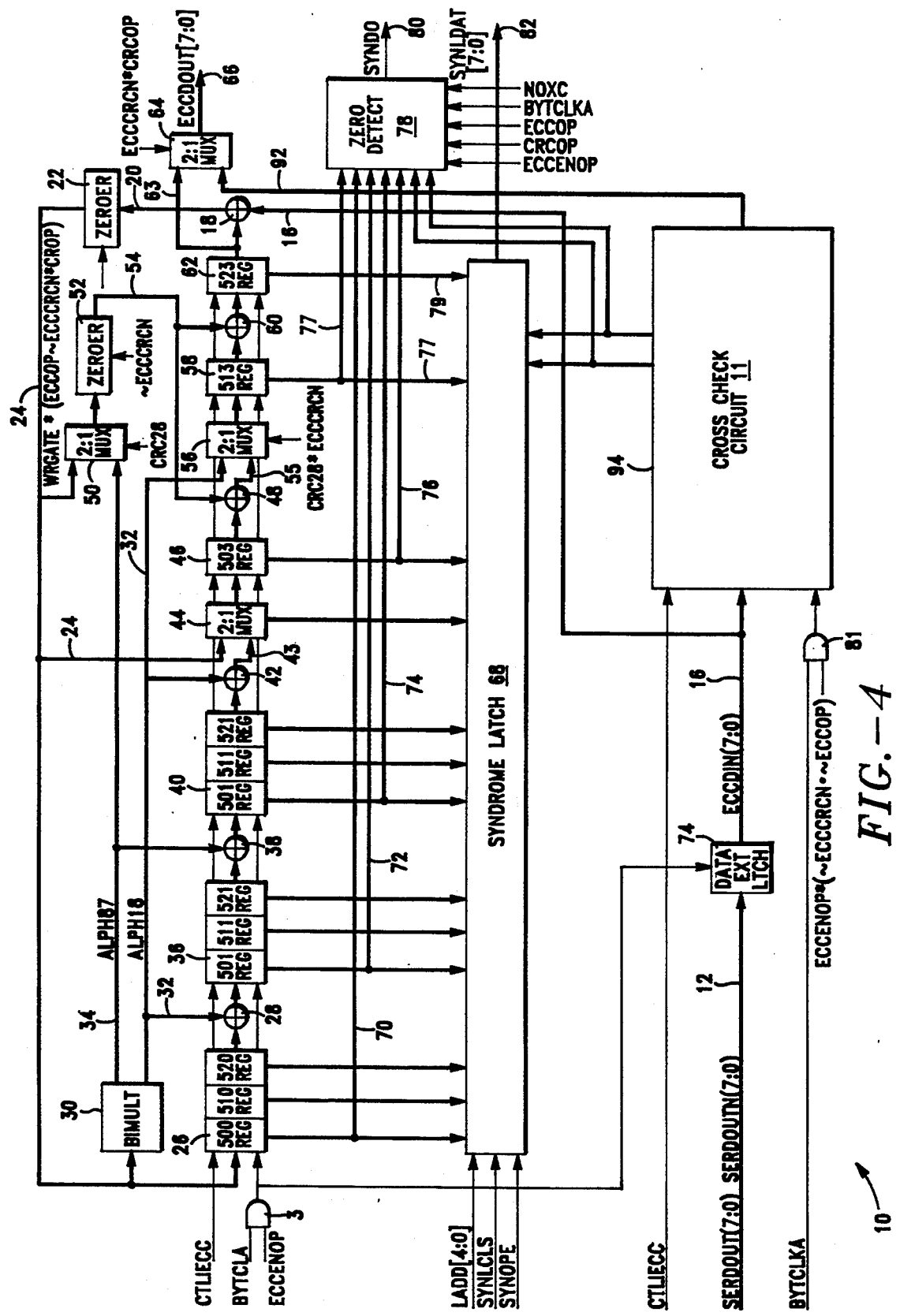
FIG. 4 is a detailed block diagram of an error correction syndrome encoder and decoder circuit incorporating the FIG. 2 or FIG. 3 cross-check encoder/decoder of the present invention.

During decoding, the circuit 11 recovers cross-check remainder bytes $RXC_0$ and $RXC_1$ of an incoming data block on the bus 16, see FIG. 4. After 514 byte clock periods for the incoming block, the $RXC_0$ and $RXC_1$ remainder bytes are located respectively in the registers 90A and 90B. If an error in this particular block has been detected as explained in the referenced parent application, the cross-check remainder bytes $RXC_0$ and $RXC_1$ are latched into a syndrome latch 68 and are transferred to cross check buffer registers of a microcontroller 196 via the syndrome latch bus 82. In the meanwhile, the 512 user data bytes of this particular block, including the byte or bytes in error, are transferred to a block buffer 214 (FIG. 6) to which the microcontroller 196 has direct memory access. The microcontroller 196 then commences execution of an error correction and cross check process while the next data block is being processed by the error correction hardware circuitry, so that at this stage, the error correction process is carried out "on-the-fly".

During execution of the error correction process, the particular data block having the error or errors (512 user bytes only) has been transferred to the block buffer memory 214 and temporarily stored at a known block address therein. The microcontroller 196 has direct memory access to each byte location to each byte being temporarily stored in this memory, so that corrected bytes may be substituted for erroneous bytes at error locations in the block. At the same time, the two cross check remainder bytes RXC0 and RXC1 and twelve ECC remainder bytes are transferred from the latch 68 to ECC buffer registers of the microcontroller 196, so that it may determine which interleave(s) contain one or more burst errors.

In executing the ECC process firmware routines, the microcontroller 196 calculates a first error value E1 and its corresponding location L1 within the particular data block, and thereupon updates the cross check syndrome bytes $NXC_0$ and $NXC_1$ in function of the error value E1 in accordance with equations (24c) and (24d) given hereinbelow. For a single burst error condition within each ECC interleave, once the cross check remainder bytes are processed into cross-check syndrome bytes they are checked to be equal to zero. If the cross-check syndrome bytes are zero, the block is deemed corrected, and is sent out from the temporary storage buffer to the host computing system. If either cross-check syndrome byte is not zero, an uncorrectable error condition is flagged.

In the case of detected multiple error bursts within at least one interleave of the particular block, a re-read of the data block is carried out on the next revolution of the disk. If the error condition persists, the computation of error values E and locations L, and update of the cross check bytes, is made iteratively on an error burst by error burst basis. After the last user data byte correction and cross check byte update is completed, the updated cross check bytes are tested to be equal to zero. If they are zero, the data is transferred from the buffer. If either cross check byte is not zero, an uncorrectable error condition is flagged.

If an error location is determined to be in a cross check byte location, or in an ECC byte location, and there is no corresponding error located within the user data field of 512 bytes, the error is ignored, and the data block is transferred from the buffer.

If an error occurs in the data, and a second error occurs in one or both cross check bytes, the iterative process of updating the cross check syndrome bytes automatically corrects them, and when the updating process based upon correction of user data bytes is completed, the updated cross-check syndrome bytes are tested to be zero. If they are zero, the data block is transferred from the buffer. If either updated cross check syndrome byte is not zero, an uncorrectable error is flagged. No correction is made to the ECC bytes.

As a generalized proposition, the calculation of the updated cross check bytes $NXC_i$ is carried out in accordance with the generalized relation for the cross-check syndrome, as follows:

$$NXC_i = (RXC1 \cdot \text{alpha}^i + RXC_0)/\text{alpha}^{2i} + \ldots E1 \cdot \text{alpha}^{iLi} \quad (24b)$$

As a further explanation of the preferred method for obtaining updated syndrome cross check bytes $NXC_0$ and $NXC_1$, a sequence of instructions included within firmware controlling the microcontroller is executed. A presently preferred process sequence is as follows:

1. Obtain cross check remainder bytes $RXC_0$ and $RXC_1$ from the syndrome latch array 68 via the syndrome data bus 82.
2. Perform the error correction by generating error correction values E1, E2, . . . E6, and associated location values L1, L2, . . . L6.
3. Compute the updated cross check syndrome byte $NXC_0$ in accordance with the following algorithm:

$$NXC_0 = (RXC_1 + RXC_0) + E1 + E2 \ldots + E6. \quad (24c)$$

If the cross check syndrome byte $NXC_0$ is not equal to zero, then flag a miscorrection. Otherwise, proceed to step 4.

4. Compute cross check syndrome byte $NXC_1$ in accordance with the following algorithm:

$$NXC_1 = (RXC1 \cdot \text{alpha}^1 + RXC_0)/\text{alpha}^2 + E1 \cdot \text{alpha}^{L1} + E2 \cdot \text{alpha}^{L2} \ldots + E6 \cdot \text{alpha}^{L6}. \quad (24d)$$

If the updated cross check byte $NXC_1$ is not equal to zero, then flag a miscorrection. Otherwise, the error correction process has functioned properly in locating and correcting the error burst(s) within a misdetection probability of one out of $256^2$, the data block is transferred from the temporary buffer block storage location, and the overall error correction firmware process is reset to await detection of an error condition in a subsequent data block.

A series of firmware routines and Galois field log and antilog lookup tables used to carry out the calculations and data manipulations associated with the FIG. 2 embodiment are set forth below. This firmware is developed for execution upon an NEC 78322 16 bit microcontroller core, or equivalent.

A potential drawback of the circuit 11 depicted in FIG. 2 is that the processing time required by the microcontroller 196 to calculate the updated cross check syndrome bytes $NXC_0$ and $NXC_1$ may prove to be excessive under some on-the-fly data handing conditions or in some hardware examples or implementations. If the calculational time proves to be excessive in a particular application, the circuit depicted in FIG. 3 may be used.

Figure 3:
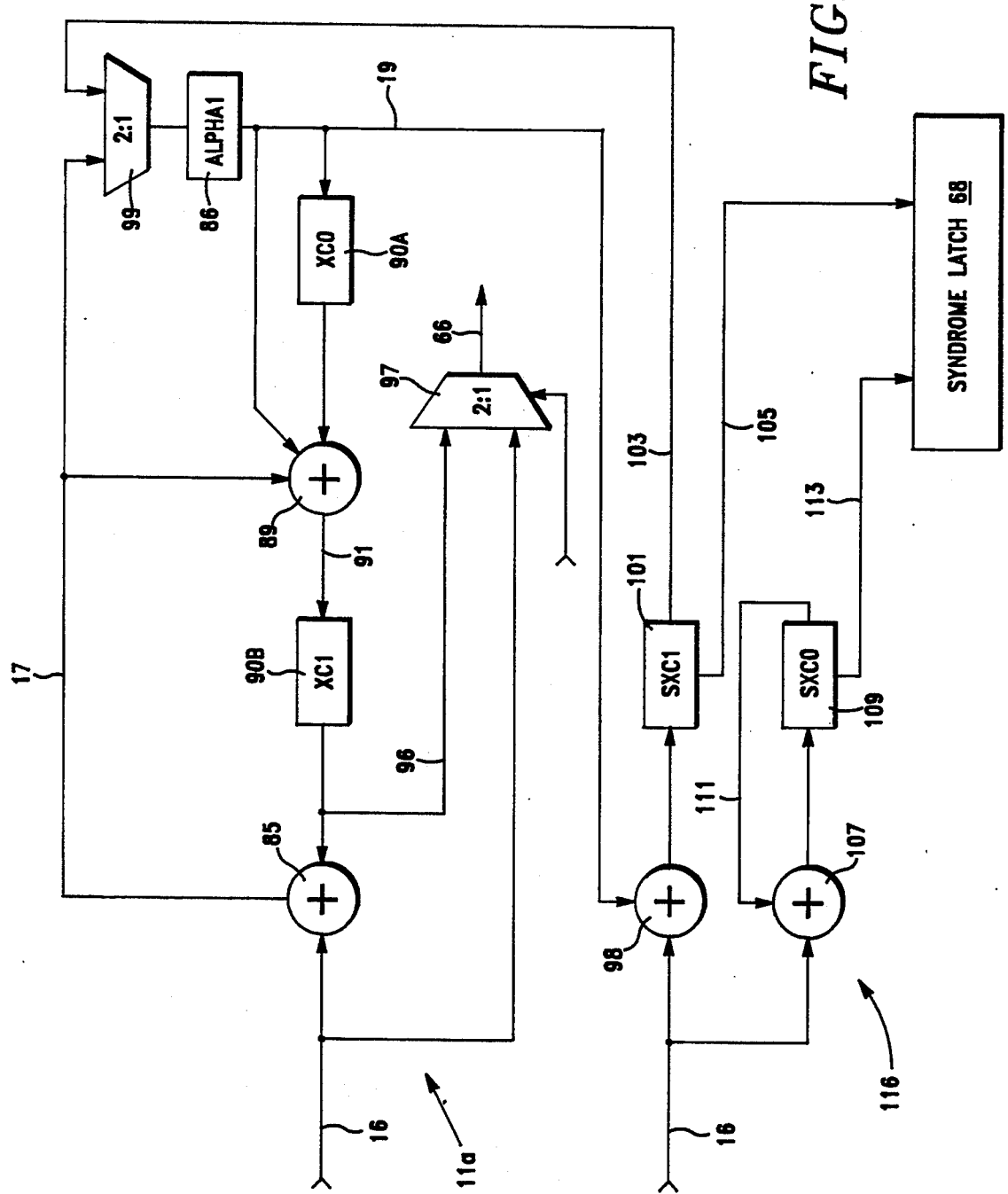
FIG. 3 is a second presently preferred embodiment of a block diagram of an encoder and a separate decoder for appending, and recovering cross-check bytes and calculating cross-check syndrome remainders from the recovered bytes, in accordance with principles of the present invention.

The FIG. 3 circuit includes a separate encoder 11a for encoding and appending the check bytes to the data stream during data writing operations, and a separate decoder 11b for decoding the syndrome bytes $SXC_0$ and $SXC_1$ from the data stream being played back during data readback operations. The encoder 11a is essentially identical to the encoder 11 depicted in FIG. 2, and the description thereof will not be repeated. The decoder 11b advantageously makes use of the alpha$^1$ multiplier 86 found within the encoder 11. A multiplexer 99 enables the multiplier 86 to be switched into the decoder circuit 11b during playback operations.

During playback, the ECC Data in is received into the decoder section 11b via a bus 16' and immediately enters a byte-wide summing junction 98. An output from the summing junction 98 leads to a cross check syndrome register 101 which recovers directly the cross-check syndrome byte $SXC_1$. An output path 105 from the register 101 leads into the syndrome latch 68.

The incoming data stream also enters another summing junction 107 which provides an output to a second cross check syndrome register 109 having an output path 111 feeding back to the summing junction 107. The syndrome register 109 recovers directly a cross-check syndrome byte $SXC_0$. An output path 113 likewise leads from the register 109 into the syndrome latch 68. The latched cross-check syndrome bytes $SXC_1$ and $SXC_0$ are then iteratively updated by the microcontroller 196 and then tested to be equal to zero, or not, in accordance with the following relations:

$$NXC_0 = SXC_0 + E1 + E2 \ldots + E_i = 0 \qquad (24e)$$

and $$NXC_1 = SXC_1 + E1 \cdot \text{alpha}^{L1} + E2 \cdot \text{alpha}^{L2} \ldots + E_i \cdot \text{alpha}^{L_i} = 0. \qquad (24f)$$

where i is equal to a maximum of 6 error bursts in the implementation of the parent application, $SXC_0 = (RXC_1 + RXC_0)/\text{alpha}^0$, (or $RXC_1 + RXC_0$), and $SXC_1 = (RXC_1 \text{alpha}^1 + RXC_0)/\text{alpha}^2$.

Thus, it will be appreciated by those skilled in the art that the decoder circuitry 11b fully implements in hardware the cross-check syndrome equations (24c) and (24d) above, thereby freeing the microcontroller 196 and its firmware for performance of other, more important tasks.

In the second implementation of FIG. 3, the microcontroller 196 performs steps 1 and 2 as in the FIG. 2 implementation above, and then updates $SXC_0$ and $SXC_1$ in accordance with equations (24e) and (24f). After all update operations are completed, the updated cross-check syndrome bytes $NXC_0$ and $NXC_1$ are tested to be zero. If each updated cross check syndrome byte equals zero, a miscorrection is not present, as determined to be within a misdetection probability of one out of $256^2$. If one of the updated cross check bytes is not equal to zero, the firmware flags other processes controlled by the microcontroller 196 in order to flag detection of a miscorrection.

When an ECC error occurs, the ECC firmware process checks to see if the error is correctable on the fly, as in accordance with the teachings of the referenced parent application. With the state of present microcontroller technology, this process takes about 200 microseconds, or less. If the detected error burst is correctable on-the-fly, the error is corrected, and checked, and then the data is transferred to a target location, such as a host computing system with which a disk drive employing the ECC method is operatively associated. If the data proves not to be correctable on-the-fly, the data block is re-read, e.g. for up to eight times, in an attempt to read the data correctly without applying a double burst ECC correction process. Before invoking the more complex double burst ECC algorithm, the ECC firmware process will always try to recover from an error by attempting to re-read the data correctly. This strategy prevents invoking double burst correction processes resulting from "soft" or non-repeating data errors. Each time a block in error is re-read a set of ECC remainders is computed. If all of the remainders equal zero, the data was read with no errors, and the block is transferred to its target location. If any of the syndrome values do not equal zero, an error has occurred, the syndrome remainder bytes, and cross check bytes are captured in, and retrieved from the syndrome latch 68, and another re-read is invoked.

When the sets of syndromes from two consecutive re-reads are the same, a "stable syndrome" has been acquired. This event may automatically trigger execution of the double error burst correction algorithm, and may lead to other actions such as defect management within the overall disk drive internal operating system.

Figure 5:
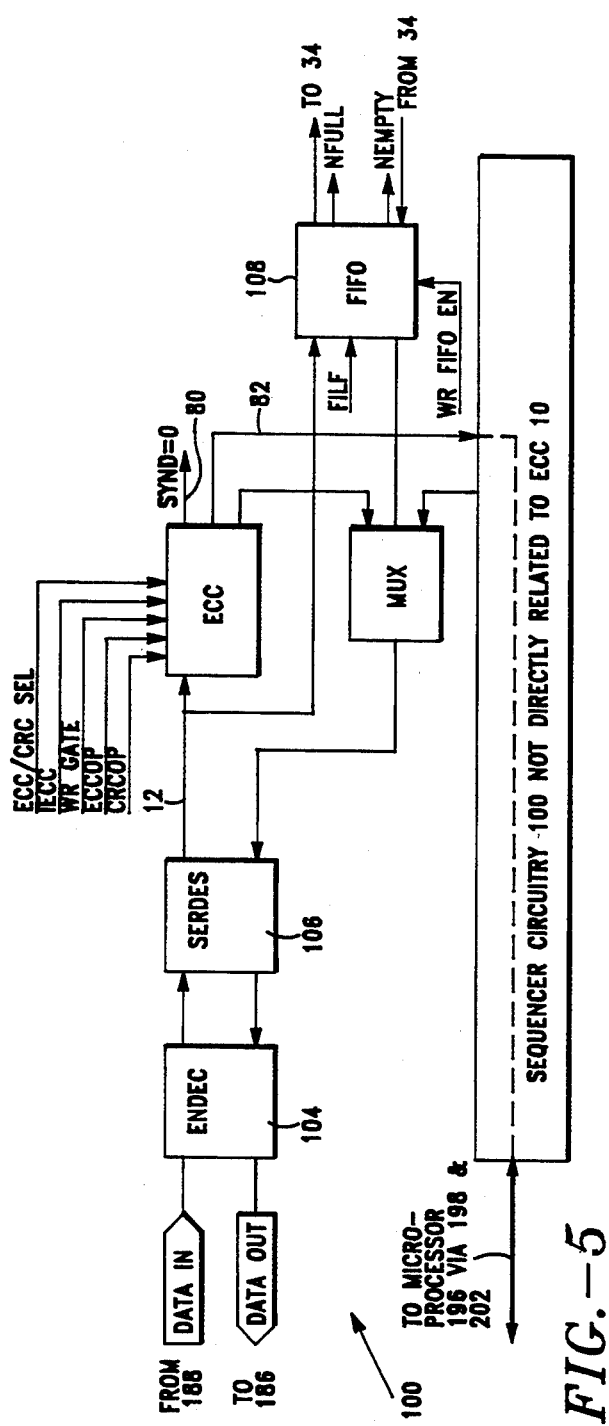
FIG. 5 is a more generalized block diagram of a data sequencer within a hard disk drive incorporating the FIG. 4 ECC circuit and a cross-check encoder/decoder in accordance with the present invention.
Figure 6:
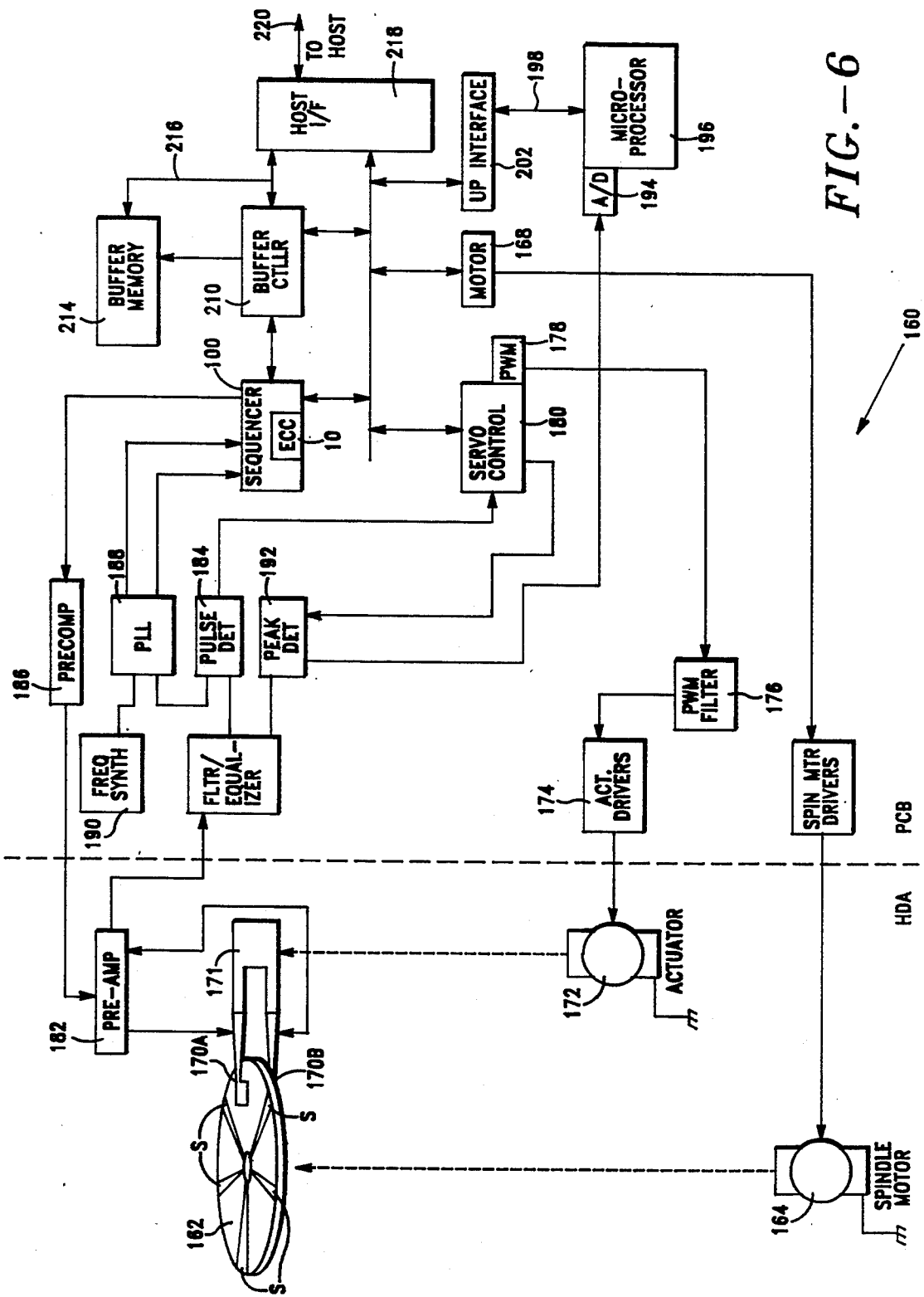
FIG. 6 is an architectural block diagram of a hard disk drive including the FIG. 4 ECC circuit and FIG. 5 sequencer.

Turning now to FIG. 5, it is to be seen that the ECC syndrome generator circuit 10 is but one functional element within a data sequencer 100 of an overall disk drive architecture 160, shown in FIG. 6. The data sequencer 100 includes, in pertinent part, a run length limited encoder/decoder (ENDEC) 104 which encodes and decodes serial data into and from e.g. a 1, 7 run length limited (RLL) code, and a serializer/deserializer (SERDES) 106 which bundles and unbundles data bytes into and from serial-by-bit data format. A FIFO byte register 108 enables data bytes to be asynchronously transferred between the sequencer 100 and an external cache buffer memory array 214. A multiplexer 110 regulates bidirectional data flow through the SERDES 106 and ENDEC 104, so that ECC syndrome bytes generated by the ECC generator (including the two cross-check bytes generated by the cross-check generator 11) may be appended to data blocks flowing to a selected data storage surface of a rotating data storage disk 162, shown in FIG. 6. Operation of the remainder of the sequencer circuitry not directly related to the ECC process is described in the referenced patent.

Referring to FIG. 6, a fixed disk drive data storage subsystem 160 includes at least one rotating data storage disk 162 which is rotated at a constant rotational velocity by a spindle motor 164. The spindle motor is controlled by a motor driver circuit 166 operating under the control of a motor control circuit 168. The data storage disk includes a plurality of embedded servo sectors S, and these sectors provide information for spindle motor speed control, and for positioning data transducer heads 170A and 170B relative to concentric data storage tracks on storage surfaces of the disk 162. An arm assembly 171 supporting the data transducer heads 170A and 170B is actuated by a mass balanced rotary voice coil actuator 172, so that the heads 170 fly in close proximity to the rotating disk 162 upon an air bearing. A coil of the actuator 172 is driven by a servo driver circuit 174 which develops bidirectional driving currents in response from pulses received from a low pass filter 176. The filter 176 is connected to a servo pulse width modulator circuit 178 within a servo control circuit 180. Servo pulses which are shaped by a pulse detector 184 and peak detected by a peak detector 192 are converted into digital values in an analog to digital converter 194 and delivered directly to the microcontroller 196. Coarse head position information read by the head 170 from the embedded servo sectors S is directly decoded by the servo control circuit 180 independent of the PLL 188, ENDEC 104 and sequencer 100.

Each data transducer head 170A and 170B is selected by head select circuitry within a preamplifier/head select/write driver circuit 182. The recovered analog data is then passed through a pulse detector 184 which transforms the analog flux transitions into digital logic edges in conventional fashion. A write precompensation circuit 186 precompensates data to be written to the disk which has been received from the sequencer 100. The phase locked loop circuit 188 operates to separate the digital edges into data bit pairs (encoded data) and delivers those data bit pairs to the ENDEC 104. A frequency synthesizer 190 enables a variety of reference frequencies to be synthesized in order to provide for zoned bit recording.

A microcontroller address/data/control bus 198 extend to a microcontroller interface 202 which directly communicates with the sequencer 100, ENDEC 104, motor controller 168, servo control circuit 180 and a buffer memory controller 210, these circuits being preferably included in a very large scale integrated circuit. The buffer memory controller 210 generates buffer addresses and supplies them to address the buffer memory 214. Data blocks are transferred to and from the FIFO register 108 within the sequencer 100 and the buffer memory 214 via a buffer data bus 216. This bus 216 also extends to an interface control circuit 218 which receives data blocks and command values via an interface bus 220 connected to a host system, and stores the values and blocks in the memory 214, and which returns status values and data blocks from the memory via the interface bus 220 to the host. A direct memory access path exists between the microcontroller 196 and the buffer memory 214 via the micro interface 202 and the buffer controller 210. With this path, it is practical for the microcontroller 196 to access particular byte locations of the buffer memory to withdraw an erroneous byte from an error location, XOR the correction value with the erroneous byte, and write a resultant value to the error location thereby to replace the erroneous value, in order to implement an on-the-fly error correction method.

Figure 7:
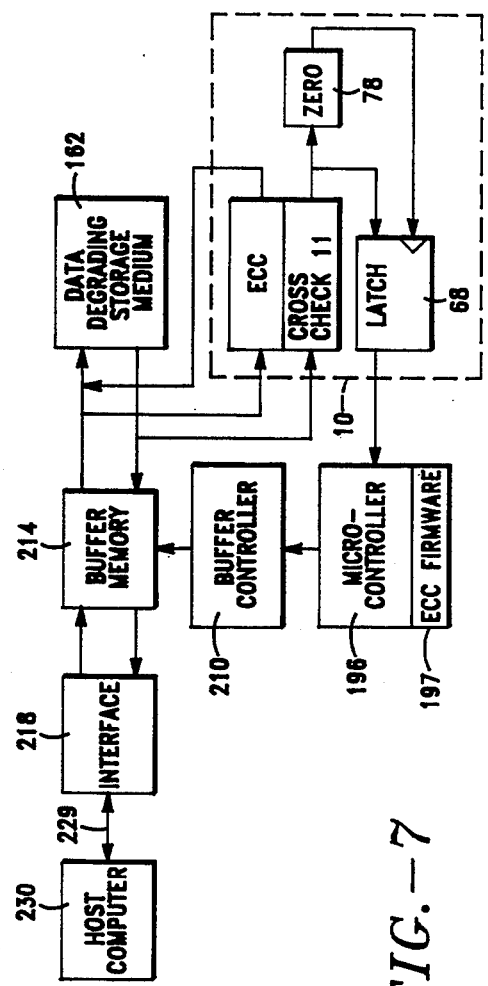
FIG. 7 is a simplified block diagram of the error correction and cross-check apparatus within the FIG. 6 hard disk drive architecture.

Thus, in FIG. 7, the error correction process is essentially seen to include the error correction circuit 10, the cross-check circuit 11, the latch 68, the programmed microcontroller 196 operating in accordance with resident ECC firmware 197, the buffer controller 210, and the buffer memory 214 which lies in a bidirectional data path extending between a host computer 230 and a data-degrading storage medium, such as the data storage disk 162. During flow of data blocks from the host computer 230 to the disk 162, the ECC circuit 10 and cross-check circuit 11 calculate error correction remainder bytes and cross check bytes upon each incoming data block. In accordance with the present invention, each of the two cross-check bytes covers the entire data field, and the error correction remainder bytes cover three interleaves of the data field, as well as the cross-check bytes.

During reverse flow, i.e. from the disk 162 to the host 230, the cross-check bytes, and error correction remainder bytes are recovered. The error correction remainder bytes are tested in the zero compare circuit 78 to detect if one or more errors are present. If so, the error correction remainder bytes and the recovered cross-check bytes are latched into the latch 68 and passed onto the microcontroller 196. The error location and a correction value are determined, and the effect of the correction value is tested upon the cross-check bytes to detect whether a miscorrection has occurred. If not, the correction value is XORed with the erroneous byte, and the result is substituted for the error within the block in the buffer memory 214. The corrected block is then ready to be passed to the host. If so, the error correction process is retried or halted, and the host is then signalled that the block includes an uncorrectable error condition.

Here follows a listing of program routines for carrying out the method steps described hereinabove in conjunction with the FIG. 2 embodiment, together with a Galois field log table, and Galois field antilog table.

```
;*************** internal subroutine                                              ; 001
;           up - D1 D0 , up dated cross check bytes                               ; 001
;           a  - e      , error pattern                                           ; 001
;           bc - L      , error displacement                                      ; 001
;           de - 'antilog table'                                                  ; 001
;                                                                                 ; 022
; Adjust the cross check partial syndrome bytes by the appropriate amount.        ; 022
; Cross check partial syndrome ls = ccpsls xor E1.                                ; 022
; Cross check partial syndrome ms = ccpsms xor (E1 * alpha^LXC).                  ; 022
; Where LXC is the reverse error offset ranging from 0 to 513. Note that if L1 >=3 then this step must be skipped since ; 022
; the error occurred in the ecc bytes only, not in the data or cross check bytes. ; 022
; LXC = (L1 * 3) + interleave - 12.                                               ; 022
;                                                                                 ; 022
; CD: correction for displace error                                               ; 022
;          iL                                                                     ; 022
; CD = e <>                                                                       ; 022
;                                                                                 ; 022
ADJUST_XC     MOVW    HL,#GF_LOG_TABLE        ; HL = address of log table.        ; 022
              SUBW    CMD_BC,#12              ; BC = Interleave + (3 * L1).       ; 022
              BL      ADJUST_XC_RET           ; If negative, error is in the ECC bytes. ; 022
              XOR     UPL,A                   ; Adjust ls partial syndrome byte.  ; 022
              MOV     A,[HL+A]                ; A = log(E1).                      ; 022
              MOV     X,A                     ; X = log(E1).                      ; 022
              MOV     A,#0                    ; AX = log (E1).                    ; 022
              ADDW    AX,BC                   ; AX = log(E1) + LXC.               ; 022
              MOV     B,#255                  ; Set up for a mod 255.             ; 022
              DIVUW   B                       ; B = (log(E1) + LXC) mod 255.      ; 022
              MOV     A,[DE+B]                ; A = antilog((log(E1) + LXC) mod 255). ; 022
              XOR     UPH,A                   ; Update the cross check partial syndrome. ; 022
;                                                                                 ; 022
ADJUST_XC_RET RET                                                                  ; 022
```

```
RS_ECC          MOVW    DE,#GF_ANTILOG_TABLE    ; Initialize pointer to antilog table.
                MOVW    HL,#GF_LOG_TABLE        ; Initialize pointer to log table.

;************* Calculate Crosscheck Syndroms from Remainders

; Convert the cross check remainder byte to a partial syndrome.
; Partial syndrome ms = ((XC1 * alpha^i) + XC0) / alpha^2.
;
; S X^2 = [ R  .X^i + R   ]  | <>^i
;  i       x1         x0
;
; S  = [ R  <>^i + R   ] / <>^2i   . .    S  = [ R  <>^i + R   ] / <>^2
;  i     x1         x0                     1     x1         x0

MOVW    UP,!SEQ_CROSSCHECK_0
                MOV     A,CMD_UPH               ; Read in the two cross check bytes.
                CMP     A,#00                   ;get Rx1
                BZ      ECC05                   ;check for zero remainder term
                MOV     A,[HL+A]                ;Rx1 * alpha^1; take log Rx1
                ADD     A,#1                    ;multiply by alpha^1
                ADDC    A,#0                    ; Do a mod 255.
                MOV     A,[DE+A]                ; Antilog
ECC05           XOR     A,CMD_UPL               ;add Rx0 to calculation
                CMP     A,#00                   ;check for zero
                BZ      ECC08
                MOV     A,[HL+A]                ; log(above)
                SUB     A,#2                    ;divide by alpha^2
                SUBC    A,#0                    ; Do a mod 255.
                MOV     A,[DE+A]                ; Antilog of the above.
                XCH     UPH,A                   ;save S1 of crosscheck and get Rx1 into A ; Now compute the other partial syndrome byte.
; Partial syndrome ls = XC1 xor XC0.
;
; S  = R   + R
;  0    x1    x0

ECC08           XOR     UPL,A                   ; Compute S0 of crosscheck
```

; This is the Galois field log table.

```
GF_LOG_TABLE  DB  0,0,3EH,14H,7CH,28H,52H,24H,0BAH,38H,66H,0DDH,90H,49H,62H,3CH
              DB  0F8H,50H,76H,67H,0A4H,48H,1CH,5DH,0CEH,87H,4CH,0A0H,0F1H,7AH,79H
              DB  37H,8DH,8EH,60H,0B4H,0C0H,0A5H,6,0E2H,0BDH,86H,1,5AH,60H,9BH,0C6H
              DB  0DH,2,2BH,64H,0C5H,7BH,8AH,0FAH,0DEH,71H,30H,20H,0BBH,6FH,0B7H,5CH
              DB  75H,70H,0CBH,0D3H,0CCH,0BBH,0ABH,83H,0F2H,0F4H,0FEH,85H,0E3H,41H,44H,11H
              DB  21H,92H,0FBH,16H,0C4H,78H,3FH,0F3H,98H,0FH,9EH,5EH,0D9H,9DH,5,8FH
              DB  4BH,0CH,40H,0A1H,69H,81H,0A2H,0BEH,4,1AH,0B9H,6CH,0C8H,56H,39H,0D4H
              DB  1DH,0DAH,0AFH,0A8H,6EH,1BH,6BH,74H,0F6H,8BH,0ADH,0D1H,0F5H,15H,9AH,27H
              DB  0B3H,3BH,0AEH,0EH,0AH,1FH,12H,29H,0BH,0FDH,0F9H,9FH,0E9H,0E5H,0C1H,0D5H
              DB  31H,1EH,33H,0EEH,3DH,0BCH,0C3H,26H,22H,88H,7FH,0C2H,82H,0C7H,4FH,2FH
              DB  5FH,51H,0DDH,20H,3AH,0B5H,54H,0D7H,3,0D2H,0B6H,47H,70H,45H,32H,95H
              DB  0D6H,0E8H,4DH,93H,0DCH,36H,9CH,6AH,18H,96H,0DBH,2EH,43H,80H,0CDH,63H
              DB  89H,0F0H,4AH,84H,7EH,0EH,0BH,0A7H,97H,0FH,61H,0E0H,0EAH,0FCH,0CFH
              DB  42H,25H,58H,0EFH,2CH,0AAH,55H,7,57H,94H,9,77H,99H,13H,0E1H
              DB  5BH,0A3H,19H,0CAH,0EH,17H,0E6H,0B1H,0ACH,91H,59H,23H,0A9H,72H,0B2H,46H
              DB  35H,4EH,0C9H,0A6H,0EH,2AH,10H,68H,34H,8,53H,0E4H,0D8H,73H,65H,8CH
```

; This is the Galois field antilog table.

```
GF_ANTILOG_TABLE  DB  1,2BH,31H,0A8H,68H,5EH,27H,0D8H,0F9H,0DBH,84H,88H,61H,30H,83H,59H
                  DB  0F6H,4FH,86H,0EH,3,7DH,53H,0E5H,0BBH,0E2H,69H,75H,16H,70H,91H,85H
                  DB  0A3H,50H,9BH,0EBH,7,0D1H,97H,7FH,5,87H,0F5H,32H,0D5H,3BH,0BBH,9FH
                  DB  3AH,90H,0AEH,92H,0AH,0FBH,0F0H,0B5H,20H,9,6EH,0A4H,81H,0FH,94H,2,56H
                  DB  62H,4DH,0D0H,0BCH,4EH,0ADH,0EFH,0ABH,15H,0DH,0C2H,60H,1BH,0B2H,0F1H,09EH
                  DB  11H,0A1H,6,0FAH,0A6H,0D7H,6DH,0D9H,0D2H,0EAH,2CH,0E0H,3FH,17H,5BH,0A0H
                  DB  2DH,0CBH,0EH,0BH,33H,0FEH,0AH,13H,0FH,64H,0B7H,76H,68H,23H,74H,3DH
                  DB  41H,39H,0EDH,0FDH,77H,40H,12H,0DCH,55H,1FH,1EH,35H,4,0ACH,0C4H,9AH
                  DB  0BDH,65H,9CH,47H,0C3H,4BH,2AH,1AH,99H,0C0H,36H,79H,0FFH,21H,22H,5FH
                  DB  0BH,0E9H,51H,0B3H,0DAH,0AFH,0B9H,0C9H,58H,0DH,7EH,2EH,0B6H,5DH,5AH,8BH
                  DB  0CH,0E7H,0EH,80H,24H,1H,26H,0A5H,0AAH,3EH,3CH,6AH,8,45H,95H,29H,67H,0CAH
                  DB  1CH,63H,66H,0E1H,14H,26H,0F3H,0C8H,73H,0ECH,0D6H,46H,0EBH,7AH,82H,72H
                  DB  0C7H,0E7H,0EEH,80H,24H,0AH,0A5H,0AAH,3EH,3CH,6CH,0F2H,9DH,6CH,0F2H,8H,45H,95H,29H,67H,0CAH
                  DB  25H,8EH,9BH,96H,54H,34H,2FH,8FH,0B0H,0A7H,0FCH,5CH,71H,0BAH,0B4H,0BH,38H,0C6H
                  DB  0A2H,7BH,0A9H,43H,6FH,8FH,0B0H,0A7H,0FCH,5CH,71H,0BAH,0B4H,0BH,38H,0C6H
                  DB  0CCH,0DFH,28H,4CH,0FBH,8DH,0D0H,0E6H,0C5H,0BH,8CH,0CDH,0F4H,19H,0E4H,93H,0D3H
                  DB  0C1H,1DH,48H,57H,49H,7CH,78H,0D4H,10H,8AH,37H,52H,0CEH,89H,4AH,1
```

Having thus described embodiments of the invention, it will now be appreciated that the objects of this invention have been fully achieved, and it will be understood by those skilled in the art that many changes in construction and widely varying embodiments and applications of the invention will suggest themselves without departing from the spirit and scope of the invention. The disclosures and the description herein are purely illustrative and are not intended to be in any sense limiting.

What is claimed is:

1. In a Reed-Solomon error correction and cross-checking apparatus for performing error correction and cross-checking upon a data block within a path containing substantially contiguous data blocks flowing from a source to a destination, the apparatus being based upon a distinguished element, alpha=$x^5+x^3+x+1$, of a Galois field whose elements are represented by residue classes of binary polynomials modulo $p(x)=x^8+x^4+x^3+x^2+1$, the apparatus including;

microcontroller means for supervising the flow of the data blocks through the path and for making calculations related to error corrections and for cross-checking error corrections in accordance with cross-checking remainder information, a buffer connected to the path for temporarily storing at least a plurality of the data blocks, the microcontroller means having direct access to the buffer for making error corrections to selected ones of the data blocks determined to be in error, and Galois finite field syndrome generator and remainder recovery circuit means connected to the path to receive the data blocks and recover therefrom plural error correction remainder bytes for each said data block and selectively to hold said plural error correction remainder bytes in a syndrome latch means, said plural error correction remainder bytes being related to syndrome bytes appended to each said data block, the syndrome latch means being directly accessed by the microcontroller means, an improved cross-check generator and remainder recovery circuit having an input connected to the path to receive each said data block and having an output connected to the path:

the cross-check generator and remainder recovery circuit for generating two cross-check bytes from each said data block and for appending the cross-check bytes to the data block during a data block encoding operation in accordance with a polynomial of the form $GXC(x)=x^2+\text{alpha}^{134}x+\text{alpha}^1$; and the cross-check generator and remainder recovery circuit for recovering cross-checking remainder information from the data block and the two cross-check bytes thereof during a data block decoding operation in accordance with the polynomial $GXC(x)=x^2+\text{alpha}^{134}x+\text{alpha}^1$ and for supplying the cross-checking remainder information to the microcontroller means.

2. The cross-checking and remainder recovery circuit set forth in claim 1 comprising a first summing junction means connected to the input, a second summing junction means, alpha$^1$ multiplier means connected to the first and second summing junction means, first cross-check byte register means connected between the first and second summing junction means and the output, second cross-check byte register means connected between the alpha$^1$ multiplier means and the second summing junction means, said first and second cross check byte register means being connected to said syndrome latch means.

3. The cross-checking and remainder recovery circuit set forth in claim 2 further comprising first multiplexer means having a first input connected to the first cross-check register means, having a second input connected to the input, and having an output connected to said path for providing said output cross, checking and remainder recovery circuit, for switching between the incoming data stream and an output of the first cross-check byte register means for appending cross-check syndrome remainder bytes to each data block following passage through the cross-checking circuit.

4. The cross-checking and remainder recovery circuit set forth in claim 2 wherein said alpha$^1$ multiplier means implements the following operations:

$Y_0=X_0+X_3+X_5$
$Y_1=X_0+X_1+X_4+X_6$
$Y_2=X_1+X_2+X_3+X_7$
$Y_3=X_0+X_2+X_4+X_5$
$Y_4=X_1+X_6$
$Y_5=X_0+X_2+X_7$
$Y_6=X_1+X_3$
$Y_7=X_2+X_4$ where $Y_0$–$Y_7$ represent eight bit positions of an output of the multiplier means and wherein $X_0$–$X_7$ are the eight bit positions of incoming data thereto, and wherein the "+" sign denotes an exclusive-OR logical operation.

5. The cross-checking and remainder recovery circuit set forth in claim 2 wherein the cross checking remainder information supplied to the syndrome latch me,ms comprises cross check remainder values $RXC_0$ and $RXC_1$ and wherein microcontroller means calculates two cross-check syndrome bytes $NXC_0$ and $NXC_1$ in accordance with the relations:

$NXC_0=(RXC_1+RXC_0)+E1+E2\ldots Ei$, and
$NXC_1=(RXC_1\cdot\text{alpha}^1+RXC_0)/\text{alpha}^2+E1\cdot\text{alpha}^{L1}+E2\cdot\text{alpha}^{L2}\ldots+Ei\cdot\text{alpha}^{Li}$, where E1, L1; E2, L2; and Ei, Li represent decoded and associated error (E) and location (L) values in the data block provided by the error correction apparatus.

6. The cross-checking and remainder recovery circuit set forth in claim 1 and including encoder means and decoder means for decoding recovered cross-check remainder bytes $RXC_0$ and $RXC_1$ into syndrome bytes $NXC_0$ and $NXC_1$ in accordance with the relations:

$NXC_0=(RXC_1+RXC_0)+E1+E2\ldots Ei$, and
$NXC_1=(RXC_1\cdot\text{alpha}^1+RXC_0)/\text{alpha}^2+E1\cdot\text{alpha}^{L1}+E2\cdot\text{alpha}^{L2}\ldots+Ei\cdot\text{alpha}^{Li}$, where E1, L1; E2, L2; and Ei, Li represent decoded and associated error (E) and location (L) values in the data block provided by the error correction apparatus.

7. The cross-checking and remainder recovery circuit set forth in claim 6 wherein said encoder means comprises:
a first summing junction means having a first input connected to the path to receive the data blocks, having a second input and having an output,
a second summing junction means having a first input connected to the output of the first summing junction means and having second and third inputs and having an output, a second multiplexing means having a first input connected to the output of the first summing junction, having a second input and having an output, an alpha$^1$ multiplier means having an input connected to the output of the second multiplexing means and having an output connected to the second input of the second summing junction means, first cross check byte register means for holding a value RXC$_1$ and being connected between the second input to the first summing junction means and the output of the second summing junction means, second cross check byte register means for holding a cross-check remainder byte RXC$_0$ and being connected between the output of the alpha$^1$ multiplier means and the third input to the second summing junction means;

said decoder means comprises:

third summing junction means having a first input connected to the path to receive the incoming stream and having a second input connected to the output of said alpha$^1$ multiplier means and having an output, first cross-check syndrome register means for holding a cross-check syndrome value SXC$_1$ and having an input connected to the output of the third summing junction and having a first output connected to the second input of said second multiplexer means and having a second output connected to said syndrome latch means, second cross-check syndrome register means for holding a cross-check syndrome value SXC$_0$ and having an input, a first output, and a second output connected to said syndrome latch means, and fourth summing junction means having a first input connected to the path to receive the incoming data blocks and having a second input connected to the first output of the second cross-check syndrome register means and having an output connected to the input of the second cross-check syndrome register means, and wherein during decoding operations said microcontroller means directly accesses said syndrome latch and iteratively updates the cross-check syndrome values SXC$_0$ and SXC$_1$ in relation to error corrections made and then compares updated cross check syndrome values NXC$_0$ and NXC$_1$ with a predetermined reference value zero, in accordance with the relationships:

NXC0 = SXC0 + E1 + E2 ... + E1 = 0, and
NXC1 = SXC1 + E1·alphaL1 + E2·alphaL2 ... + Ei·alpha$^{Li}$ = 0 where i is equal to a maximum of six error bytes,
SXC0 = (rxc1 + RXC0)·alpha0, and
SXC1 = (RXC1·alpha1 + RXC0)/alpha2, the output of said second multiplexing means being connected to said first input of said second multiplexing means during encoding operations of said cross-check generator and remainder recovery circuit and being connected to said second input of said second multiplexing means during decoding operations of said cross-check generator and remainder recovery circuit.

8. A method for cross-checking the correctness of a correction made to a data block of a predetermined number of bytes by an error correction process, wherein the error correction process divides the predetermined number of data bytes of the data block into a plurality of interleave segments, the method comprising the steps of:

a. developing a plurality of cross-check bytes, each being based upon the predetermined number of bytes comprising the data block without respect to said interleave segments, in accordance with a predetermined cross check algorithm, and appending the developed plurality of cross-check bytes to the data block, b. developing at least one error correction byte based upon the data bytes and any cross-check byte within each said interleave segment, and appending the developed error correction bytes to the data block, c. passing the data block including appended cross-check bytes and error correction bytes through a potentially degrading data transfer medium, d. recovering the data block including recovering cross-check bytes and error correction bytes from the data transfer medium, e. converting the recovered cross-check bytes into cross-check syndrome bytes, f. comparing the recovered error correction bytes to a reference value to determine if error is present in said recovered data block, g. locating and correcting an error determined to be present in a said interleave segment of said recovered data block by reference to at least one of said recovered error correction bytes developed within said segment, h. updating the cross-check syndrome bytes by reference to correction of the error determined to be present, and i. comparing the updated cross-check syndrome bytes to a predetermined value to cross-check the correctness of the locating and correcting step.

9. The cross-checking method set forth in claim 8 wherein the error correction process comprises a Reed-Solomon error correction process for performing error correction and cross checking upon the data block using logic apparatus based upon a distinguished element, alpha = $x^5 + x^3 + x + 1$, of a Galois field whose elements are represented by residue classes of binary polynomials modulo p(x) = $x^8 + x^4 + x^3 + x^2 + 1$, and wherein the predetermined cross-checking algorithm comprises a Reed-Solomon cross-checking code in accordance with a polynomial GXC(x) = $x^2$ + alpha$^{134}$x + alpha$^1$.

10. The cross-checking method set forth in claim 9 wherein an alpha$^{134}$ multiplier term of the polynomial GXC(x) is carried out by implementing an alpha$^1$ multiplier:

$Y_0 = X_0 + X_3 + X_5$
$Y_1 = X_0 + X_1 + X_4 + X_6$
$Y_2 = X_1 + X_2 + X_3 + X_7$
$Y_3 = X_0 + X_2 + X_4 + X_5$
$Y_4 = X_1 + X_6$
$Y_5 = X_0 + X_2 + X_7$
$Y_6 = X_1 + X_3$
$Y_7 = X_2 + X_4$ and then performing an exclusive-OR operation upon a resultant product with x, where $Y_0$–$Y_7$ represent eight bit positions of an output of a multiplier means for carrying out the alpha$^{134}$ multiplication and exclusive-OR operation, and wherein $X_0$–$X_7$ are eight bit positions of incoming data thereto, and wherein the "+" sign denotes an exclusive-OR logical operation.

11. The cross-checking method set forth in claim 8 wherein the data transfer medium comprises a data storage surface of a fixed disk drive data storage subsystem.

12. In a bidirectional data transfer path between a host computing system and a data-degrading storage medium, the path including a buffer memory, and within an error correction process including generating a plurality of error correction remainder bytes based upon a distinguished element, alpha=$x^5+x^3+x^1$, of a Galois field whose elements are represented by residue classes of binary polynomials modulo $p(x)=x^8+x^4+x^3+x^2+1$ with a Reed-Solomon encoder/decoder during passage of a data block through the data transfer path from the host computing system to the data-degrading storage medium when the plurality of error correction remainder bytes are appended to the data block before reaching the data-degrading storage medium; and, during passage of the data block from the data-degrading storage medium to the host computing system through the data transfer path recovering the error correction remainder bytes with the Reed-Solomon encoder/decoder, and testing the recovered bytes against a predetermined value to determine if an error is present, and if an error is present, locating and generating a corrected value for the error from the recovered error correction remainder bytes with a microprocessor means, an improved method for cross-checking the step of correcting the error comprising the steps of:

during passage of the data block through the data transfer path from the host computing system to the data-degrading storage medium, generating with a Reed-Solomon cross-check circuit a plurality of cross-check bytes based on the data block as residue classes of binary polynomials modulo $pxc(x)=x^2+alpha^{134}x+alpha^1$, appending the cross-check bytes to the data block before it reaches the data-degrading storage medium, and generating the plurality of error correction remainder bytes from the data block including the appended cross-check bytes; and, during passage of the data block through the data transfer path from the data-degrading storage medium to the host computing system and if an error is present, recovering the cross-check bytes from the block, transferring the cross-check bytes to the microprocessor means, testing an effect of the corrected value with the microprocessor means upon the cross-check bytes to detect a miscorrection, and in the absence of a detected miscorrection, replacing the error with the corrected value in the data block in the buffer memory via direct access by the microprocessor means.

13. The method set forth in claim 12 wherein the data-degrading storage medium comprises a rotating magnetic data storage disk.

14. The method set forth in claim 12 wherein the step of generating with a Reed-Solomon cross-check circuit a plurality of cross-check bytes based on the data block as residue classes of binary polynomials modulo $pxc(x)=x^2+alpha^{134}x+alpha^1$ includes the steps of reducing $alpha^{134}$ to $(1+alpha^1)$ and using a single $alpha^1$ multiplier.

* * * * *